(12) United States Patent
Panabaker et al.

(10) Patent No.: US 8,423,700 B2
(45) Date of Patent: Apr. 16, 2013

(54) HYBRID MEMORY DEVICE WITH SINGLE INTERFACE

(75) Inventors: Ruston Panabaker, Bellevue, WA (US); Jack Creasey, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 557 days.

(21) Appl. No.: 12/771,670

(22) Filed: Apr. 30, 2010

(65) Prior Publication Data

US 2010/0217924 A1  Aug. 26, 2010

Related U.S. Application Data

(63) Continuation of application No. 11/449,435, filed on Jun. 7, 2006, now Pat. No. 7,716,411.

(51) Int. Cl.
*G06F 12/00* (2006.01)
*G06F 13/00* (2006.01)

(52) U.S. Cl.
USPC ........... 711/101; 711/100; 711/103; 711/105; 711/154

(58) Field of Classification Search ................... 711/100, 711/101, 103, 105, 154, 170
See application file for complete search history.

(56) References Cited

U.S. PATENT DOCUMENTS

| | | | |
|---|---|---|---|
| 5,412,612 A | 5/1995 | Oyama | |
| 5,581,505 A | 12/1996 | Lee | |
| 5,701,433 A * | 12/1997 | Moriarty et al. | 711/154 |
| 5,813,038 A * | 9/1998 | Thome et al. | 711/154 |
| 6,208,581 B1 | 3/2001 | You | |
| 6,366,530 B1 | 4/2002 | Sluiter | |
| 6,380,581 B1 | 4/2002 | Noble | |
| 6,418,506 B1 | 7/2002 | Pashley | |
| 6,456,517 B2 | 9/2002 | Kim et al. | |
| 6,496,854 B1 | 12/2002 | Hagersten | |

(Continued)

FOREIGN PATENT DOCUMENTS

| | | |
|---|---|---|
| EP | 0566306 | 10/1993 |
| WO | WO 2008131058 | 10/2008 |

OTHER PUBLICATIONS

Micron Technology Announces SyncflashTM Memory, A New Flash Memory Technology. Nov. 22, 1999, Http://www.micron.com/news/product/1999-11-16197.html?print_yes.
On Using Network RAM as a Non-Volatile Buffer. Aug. 1998. Http://archvlsi.ics.forth.gr/html_papers/TR227/TR.html.

(Continued)

*Primary Examiner* — Tuan V. Thai
(74) *Attorney, Agent, or Firm* — Workman Nydegger (57) ABSTRACT

Described is a technology by which a memory controller is a component of a hybrid memory device having different types of memory therein (e.g., SDRAM and flash memory), in which the controller operates such that the memory device has only a single memory interface with respect to voltage and access protocols defined for one type of memory. For example, the controller allows a memory device with a standard SDRAM interface to provide access to both SDRAM and non-volatile memory with the non-volatile memory overlaid in one or more designated blocks of the volatile memory address space (or vice-versa). A command protocol maps memory pages to the volatile memory interface address space, for example, permitting a single pin compatible multi-chip package to replace an existing volatile memory device in any computing device that wants to provide non-volatile storage, while only requiring software changes to the device to access the flash.

20 Claims, 10 Drawing Sheets

U.S. PATENT DOCUMENTS

| | | |
|---|---|---|
| 6,564,285 B1 | 5/2003 | Mills |
| 6,670,234 B2 | 12/2003 | Hsu |
| 6,804,146 B2 | 10/2004 | Johnson |
| 6,850,995 B1 * | 2/2005 | Shishizuka et al. ............. 710/20 |
| 6,892,270 B2 | 5/2005 | Roohparvar |
| 6,928,512 B2 | 8/2005 | Ayukawa |
| 7,062,618 B2 | 6/2006 | Tsunoda |
| 7,360,022 B2 | 4/2008 | Tian |
| 7,613,880 B2 | 11/2009 | Miura |
| 2003/0206478 A1 | 11/2003 | Ayukawa et al. |
| 2005/0027928 A1 | 2/2005 | Avraham |
| 2005/0102444 A1 | 5/2005 | Cruz |
| 2005/0128853 A1 | 6/2005 | Ayukawa |
| 2005/0182893 A1 | 8/2005 | Suh |
| 2005/0204091 A1 | 9/2005 | Kilbuck |
| 2006/0184710 A1 * | 8/2006 | Valdivia et al. ............... 710/315 |
| 2006/0294295 A1 | 12/2006 | Fukuzo |

OTHER PUBLICATIONS

U.S. Appl. No. 11/449,435, Jan. 28, 2008, Office Action.
U.S. Appl. No. 11/449,435, Dec. 4, 2008, Office Action.
U.S. Appl. No. 11/449,435, May 26, 2009, Office Action.
U.S. Appl. No. 11/449,435, Jan. 26, 2010, Notice of Allowance.

* cited by examiner

HYBRID MEMORY DEVICE WITH SINGLE INTERFACE

CROSS-REFERENCE TO RELATED APPLICATIONS

This application is a continuation of, and claims priority to and the benefit of, U.S. patent application Ser. No. 11/449,435, filed on Jun. 7, 2006 and entitled "HYBRID MEMORY DEVICE WITH SINGLE INTERFACE," which application is expressly incorporated herein by this reference in its entirety.

BACKGROUND

Various existing and new computing devices make use of high speed, volatile memory (e.g., dynamic random access memory, or DRAM) to hold operating instructions and data. Such devices include mobile phones, television set-top boxes, personal computer memory, and so forth. Increasingly computing devices are also including large amounts of relatively inexpensive nonvolatile NAND flash memory to store applications and data.

However, many existing DRAM-based computer devices are designed without the appropriate bus interfaces to support NAND flash memory; to support NAND flash memory requires a costly and lengthy redesign of the device chipset. Similarly, most NAND flash-based devices cannot simply add DRAM. Significant changes to a device's physical architecture are required to put flash memory into an updated model of what was a DRAM-based device, for example, or vice-versa.

While a combination of volatile and nonvolatile memory provides benefits in many situations, often the expense of redesigning a device chipset is too costly/risky for a vendor, whereby the vendor forgoes new features and business models that would be otherwise enabled by having volatile and nonvolatile memory in a device. Further, there is no straightforward way to use existing architectural models and, for example, update an existing DRAM-based device with NAND flash memory; e.g., an entire circuit board would need to be redesigned and replaced, instead of simply adding memory to or changing memory in an existing device (and updating software as appropriate). Moreover, there is a large difference in bus speeds between non-volatile and DRAM-based memory.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a hybrid memory device that includes a first type of memory (e.g., volatile DRAM-type memory) and an interface corresponding to the first type of memory, and a second type of memory (e.g., nonvolatile flash-type memory). The memory device includes a controller that is coupled to the interface, to the first type of memory and to the second type of memory. Based on information such as commands and/or memory addresses received at the interface, the controller determines whether a command such as an I/O request (e.g., a read or write) is directed to the first type of memory or to the second type of memory.

Thus, by receiving commands, addresses and data at a controller of the hybrid memory device, different types of memory may be accessed by software (e.g., device firmware or a program) via a single interface defined for one type of memory. The controller includes logic that determines whether a command/address received on the interface of a first type of memory is directed to a second type of memory associated with the memory device, and if so, outputs signals to the second type of memory to communicate at least one command to the second type of memory and/or to perform at least one data input/output (I/O) operation on the second type of memory.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Exemplary Operating Environment

Figure 1:
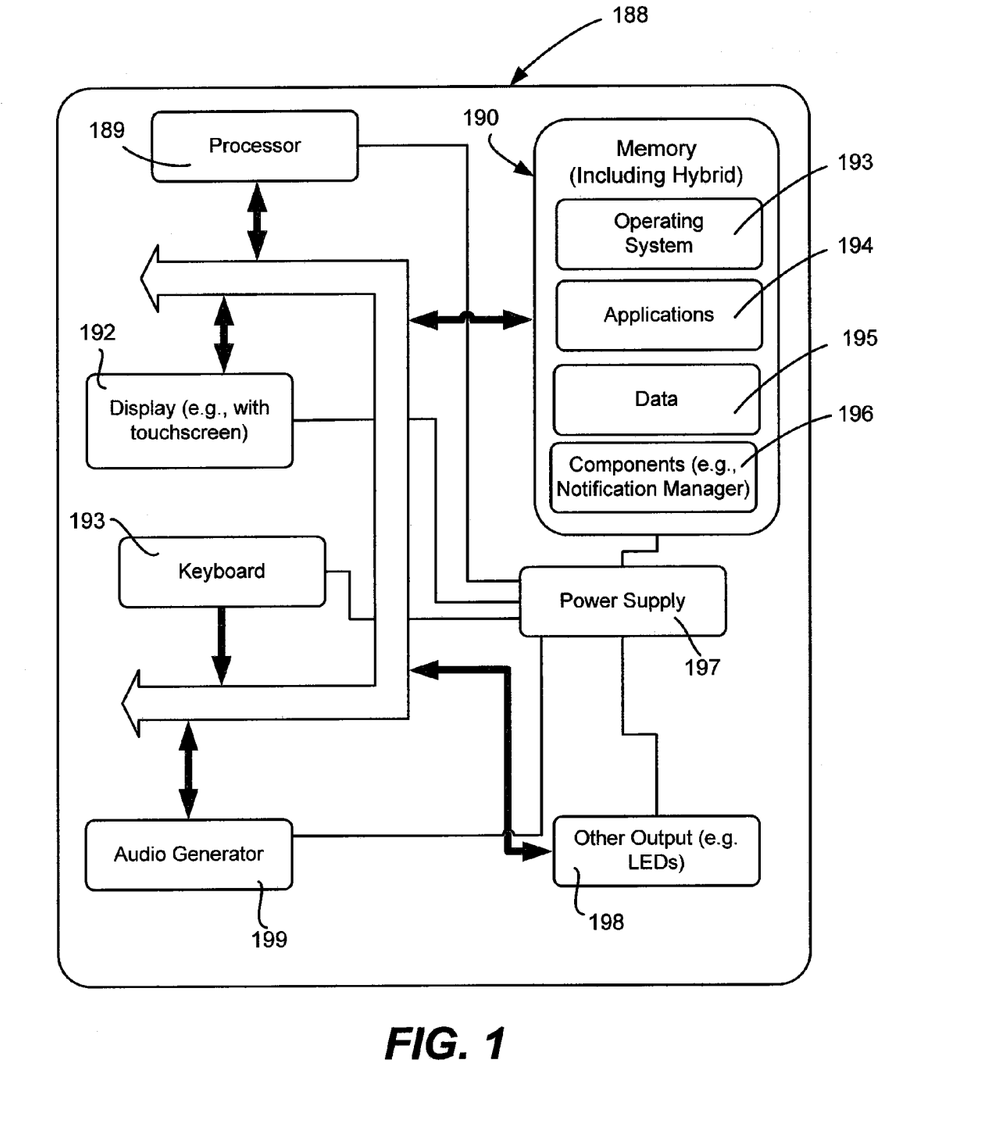
FIG. 1 shows an illustrative example of a computing device into which various aspects of the present invention may be incorporated.

FIG. 1 illustrates an example of some suitable functional components of a computing device 188, such as may be found in a handheld/pocket-sized/tablet-type personal digital assistant, appliance, mobile phone and so forth, including a processor 189, a memory 190, a display 192, and a keyboard 193 (which may be a physical or virtual keyboard). The memory 190 generally includes both volatile memory (e.g., RAM) and nonvolatile memory (e.g., ROM, PCMCIA cards, and so forth). Further, as described below, the exemplary memory 190 includes a hybrid memory device (corresponding to one or more chips) that contains more than one type of memory, such as flash and DRAM or flash and SDRAM (Synchronous DRAM), in which one of types shares the other's interface. An operating system 193 may be resident in the memory 190 and executes on the processor 189, such as a Microsoft® Windows®-based operating system, or another operating system.

One or more application programs 194 and data 195 may be in the memory 190, e.g., with the programs 194 run on the operating system 193. Examples of applications include email programs, scheduling programs, PIM (personal information management) programs, word processing programs, spreadsheet programs, Internet browser programs, and so forth. The computing device 188 may also include other components 196 such as a notification manager loaded in the memory 190, which executes on the processor 189. The notification manager for example may handles notification request, e.g., from the application programs 195.

The computing device 188 has a power supply 197, for example implemented as one or more batteries or a light-powered system. The power supply 197 may further include an external power source that overrides or recharges the built-in batteries, such as an AC adapter or a powered docking cradle.

The exemplary computing device 188 represented in FIG. 1 is shown with three example types of external output devices, including the display 192, other output mechanisms 198 (e.g., one or more light emitting diodes, or LEDs) and an audio generator 199, e.g., coupled to integrated speakers and/or to an audio jack. One or more of these output devices may be directly coupled to the power supply 197 so that when activated, it remains on for a duration dictated by a notification mechanism even though the processor 189 and other components might shut down to conserve battery power. For example, an LED may remain on (as long as some power is available) until the user takes action. Others may be configured to turn off when the rest of the system does or at some finite duration after activation.

Hybrid Memory Device with Single Interface

Various aspects of the technology described herein are generally directed towards expanding a memory of a computing device (such as the device 188) with respect to having relatively large amounts of volatile and nonvolatile memory in the computing device, without requiring changes to an existing physical architecture of that computing device. In general, the description herein provides examples of incorporating NAND flash memory into a SDRAM-based device by adding or substituting a hybrid memory device (e.g., comprising one or more chips) containing SDRAM and the NAND flash, in which the hybrid memory device has the same interface (including pinout, voltage protocol, and access protocol) as a conventional SDRAM component. However, as will be understood, these aspects and concepts apply to any type or types of volatile and/or nonvolatile memory, e.g., various types of DRAM (e.g., EDO) may be used instead of SDRAM, DRAM or SDRAM can be conversely incorporated into a flash-based device, NOR-based flash memory may be mixed with SDRAM and/or with NAND-based flash, static RAM (SRAM) or other types of RAM may be one of the types of memory, more volatile memory can be added in place of an existing volatile memory device, more nonvolatile memory can be added in place of an existing nonvolatile memory device, and so forth. Note that the incorporating of different memory types into a hybrid memory device (with an interface that ordinarily corresponds to an original type of memory for a given design) typically adds overall memory to a device, but need not necessarily increase (and if desired by the designer can decrease) the amount of the original type of memory and/or the overall amount of memory.

Moreover, as will be understood, the concepts described herein are not limited to what are considered conventional computing devices (e.g., desktop, notebook, laptop, or tablet-based computer systems, personal digital assistants, pocket-sized personal computers, or the like), but rather may be used in any device that has a need for storing data in volatile or non-volatile memory, including mobile phones, set-top-boxes, hybrid hard disks, television sets, remote controls, audiovisual devices, electrical appliances, household appliances and so forth. Each of these devices may add nonvolatile memory to a volatile memory design, or vice-versa, or increase memory, without costly and risky hardware redesigns. In this manner, for example, a device with volatile memory such as a mobile phone can now have large amounts of non-volatile storage included in it such as to store programs, music, images, and so forth, simply by replacing a memory chip (or multiple memory chips), and updating some firmware to work with the non-volatile storage, as described below.

As such, the present invention is not limited to the examples, structures or functionality described herein. Rather, any of the examples, structures or functionalities described herein are non-limiting, and the present invention may be used various ways that provide benefits and advantages in computing and data storage in general.

Figure 2:
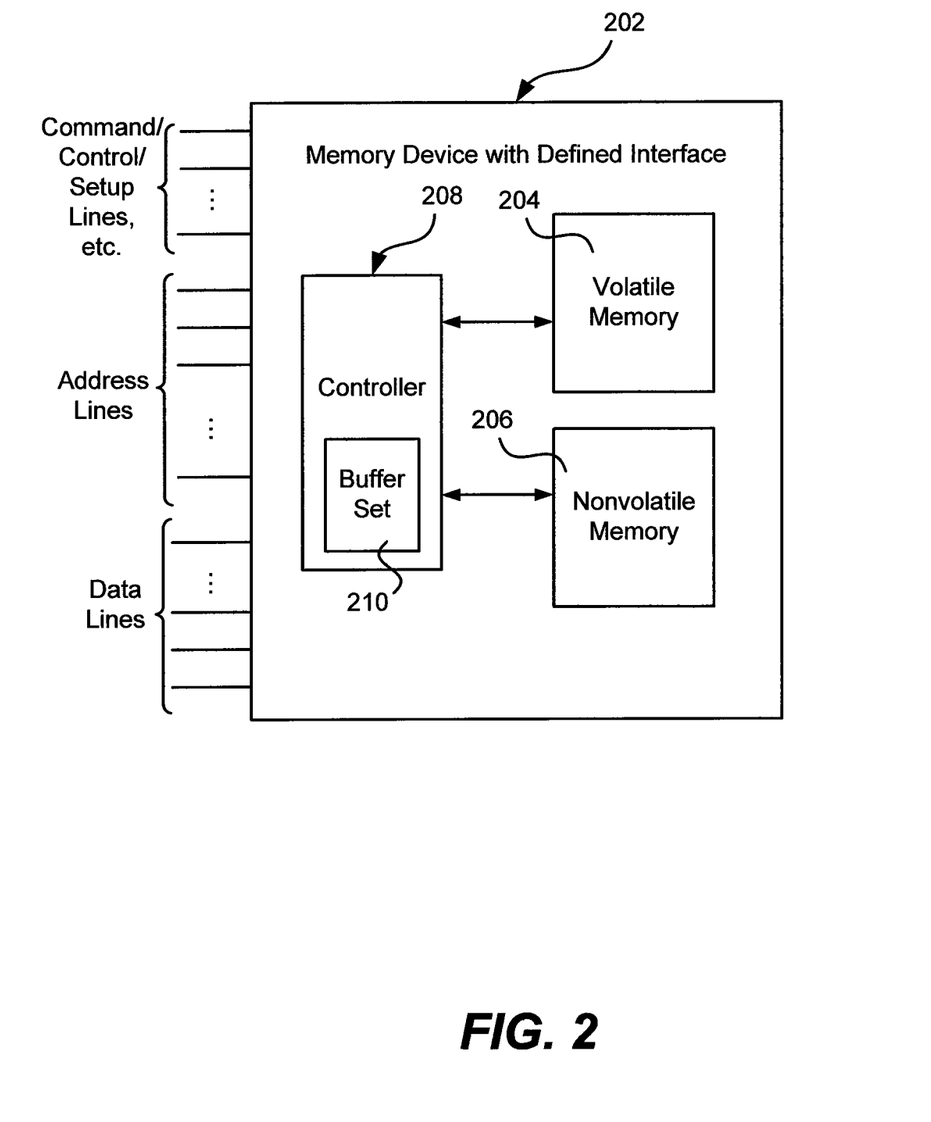
FIG. 2 is a representation of an example hybrid memory device including a controller and two types of memory that are each accessible by a single interface defined for one of the memory types.

Turning to FIG. 2 of the drawings, there is shown a general example concept of a hybrid memory device 202 device including volatile memory 204 (e.g., SDRAM) and nonvolatile memory 206 (e.g., NAND flash). A controller 208 contains logic that determines which of the memories 204 or 206 to access, based on addresses and commands, e.g., originated at firmware/software and addressed through a CPU.

As represented in FIG. 2, the controller 208 may include or otherwise be associated with a buffer set 210 comprising one or more buffers, which in one implementation is used for speed matching purposes. For example, at present SDRAM is significantly faster than flash, and thus a hybrid memory chip that has an interface that appears to external components be an SDRAM device needs to buffer data in the buffer set 210 (e.g., SDRAM, DRAM or SRAM) in order to comply with the SDRAM protocol with respect to speed and output requirements, including burst mode requirements. Thus, the buffer set 210 typically comprises memory such as SDRAM or static RAM (SRAM) that is at least as fast as a given SDRAM chip and its protocol requires, otherwise the hybrid device at times would appear to external components to be bad memory. Note that a hybrid memory device that added fast memory (e.g., SDRAM) to a slower (e.g., flash) interface would not necessarily need such a buffer.

Figure 3A:
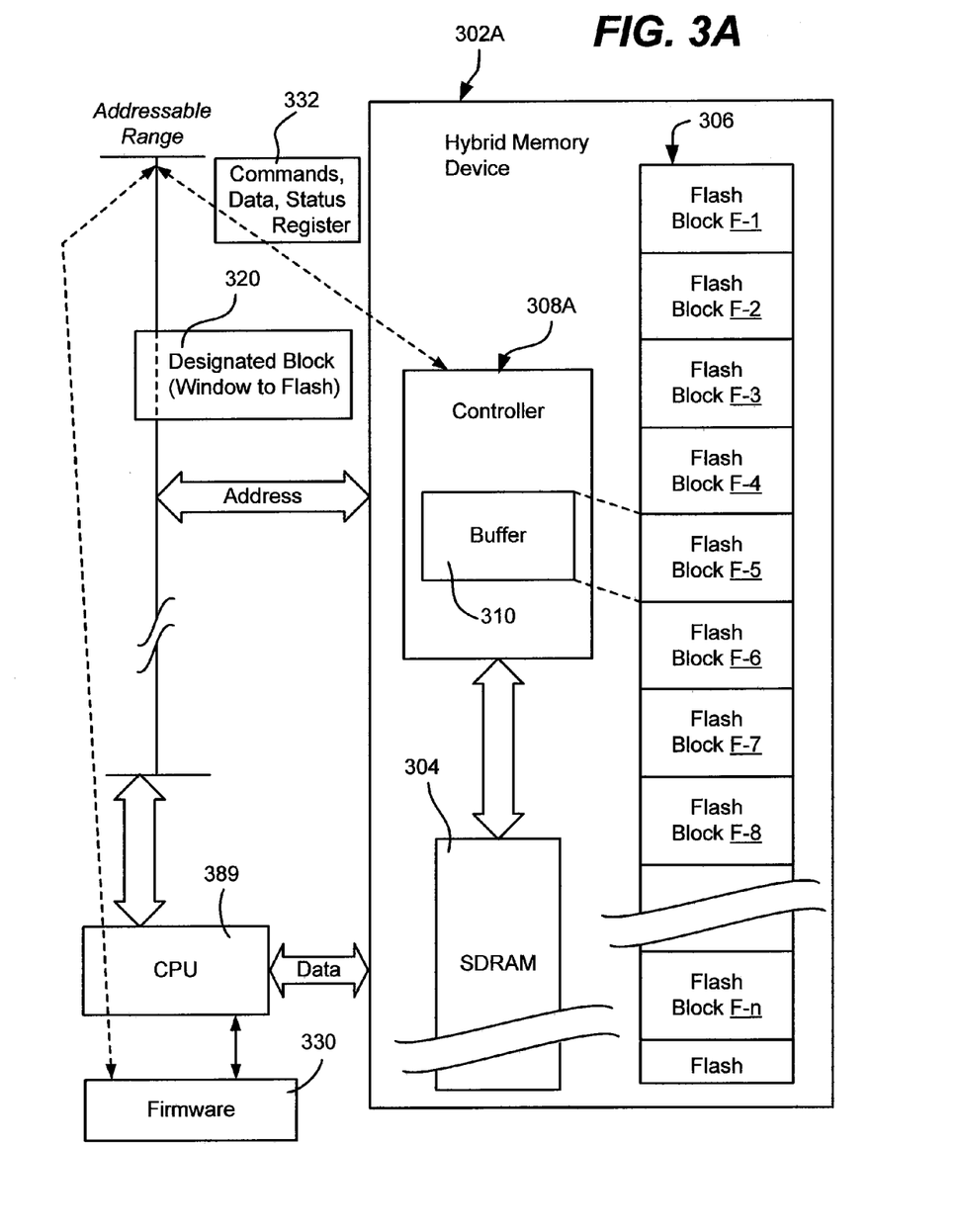
FIG. 3A is a representation of an example hybrid memory device with an SDRAM interface with SDRAM and flash memory that is accessed via a designated block of memory in SDRAM addressable space.

FIG. 3A shows an example concept of how one hybrid memory device 302A generally operates, in which flash memory 306 is arranged as some number of blocks (e.g., blocks F-1 through F-n) and is accessed through an SDRAM interface. The hybrid memory device 302A also includes an SDRAM device 304. As described below, an on-chip controller 308A (e.g., corresponding to the controller 208 of FIG. 2) determines which section of SDRAM 304 or flash to access with respect to a current address originated at the CPU 389. In general, the controller 308A receives commands, data and addresses from the CPU 389 that are output according to the conventional SDRAM protocol. Note that the CPU is not required to know anything about the different types of memory on the hybrid chip, and operates as normal over its existing SDRAM-based bus.

In FIG. 3A, the controller 308 includes logic that can detect addresses sent to the hybrid device's SDRAM address lines that are part of its interface. Some of the addresses in the addressable address range correspond to SDRAM, and for those addresses, the controller 308A allows the addresses, commands and data to be handled by the SDRAM device 304 (e.g., forwards the equivalent ones and zeros or does not disable the device from seeing the ones and zeros). As a result for those addresses the hybrid device acts as a conventional SDRAM device.

Certain addresses in the addressable range, however, (typically comprising a contiguous range referred to as a designated block 320) are known to the controller 308 to be associated with the flash, and essentially act as a window into the flash memory 306. For example, the designated block may correspond to the flash block size, e.g., 128 KB in one type of flash device. When addresses within the designated block 320 are transferred, the SDRAM device 304 is disabled (actually or effectively) by the controller 308. The controller 308 instead sends commands to the flash memory device 306, or controls the flow of read and write data to the flash memory device 306. Depending on the design, the controller 308 may disable the SDRAM component 304 by changing an appropriate device input line (e.g., chip enable) of the device 304 to disable, by not forwarding received addresses to the device 304, and/or by forwarding the addresses (e.g., if needed for refresh) but not allowing data writes or returning any data for a read.

Note that the amount of flash 306 is not limited to the size of the designated block 320; rather there may be multiple flash blocks (or other arrangements of flash memory), with the controller 308 accessing each block or the like according to additional mapping information that identifies which part (e.g., block) of the total flash 306 is to be accessed. This additional mapping information may be written to other memory locations known to the controller 308, e.g., at the high end of addressable memory, (or possibly as a supplement to the designated block). Firmware 330, already present on essentially all computing devices, may be updated to read and write this information in accordance with a suitable protocol via the CPU 389, (as represented in FIG. 3A by the dashed lines from the firmware 330 through the CPU 389 to the controller 308A; in this manner, commands, data and status information 332 may be communicated between the device firmware 330 (and/or other requesting code, hereinafter referred to as the firmware 330 for simplicity) and the hybrid memory device 302A.

Figure 3B:
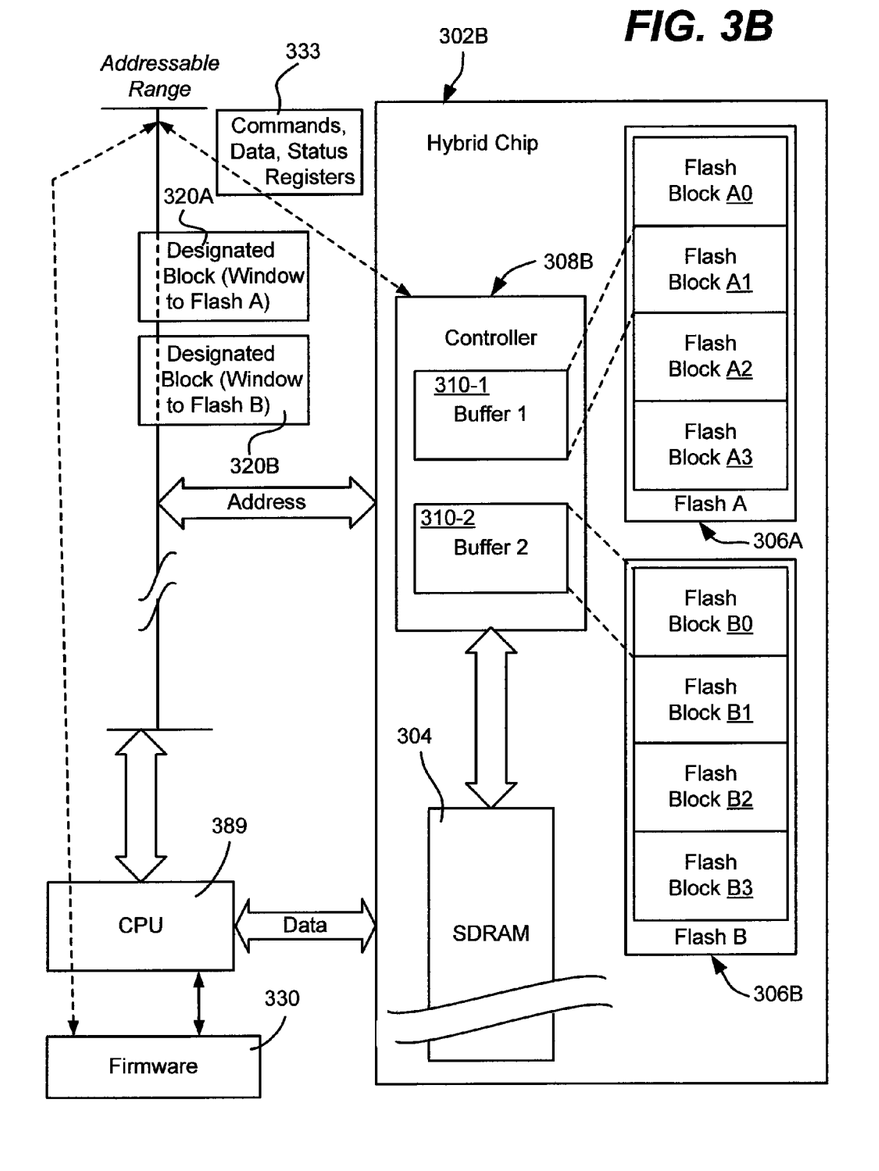
FIG. 3B is a representation of an example hybrid memory device with an SDRAM interface with SDRAM and flash memory that is accessed via a plurality of designated blocks of memory in SDRAM addressable space.

FIG. 3B is a representation of a similar concept to that of FIG. 3A, except that in FIG. 3B the alternative controller 308B may have multiple buffers 310-1 and 310-2 corresponding to multiple windows 320A and 320B, separately mapped to multiple flash blocks (e.g., currently flash block A1 and Flash block B0 in FIG. 3B). As can be readily appreciated, while only two such parallel (and thus typically faster) accesses to flash memory devices are shown in FIG. 3B, any practical number may be used.

Figure 4:
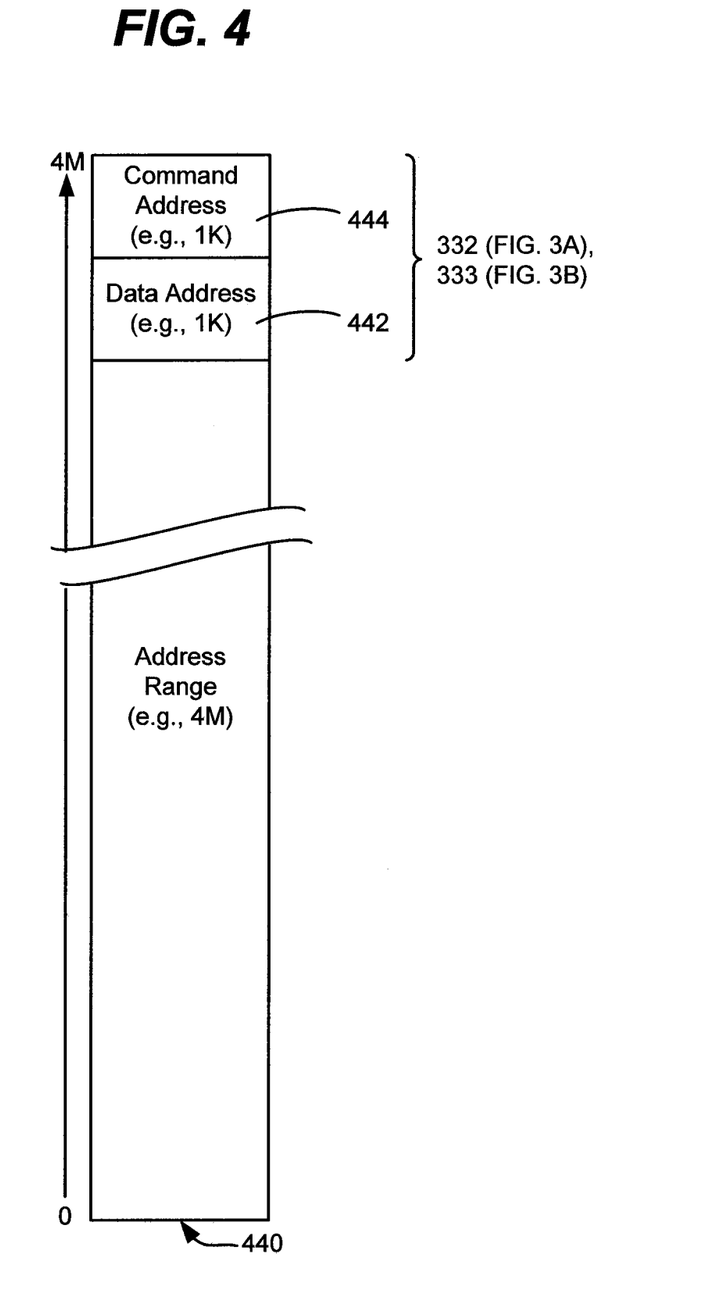
FIG. 4 is a representation of addressable memory space corresponding to a first type of memory with sections used for communicating data and commands with a second type of memory.

By way of example of how the controller maps the window (FIG. 3A) or windows (FIG. 3B) to the correct section or sections of flash, FIG. 4 shows a linearly-represented address range 440 corresponding to the range of a conventional SDRAM device, which in this example is 4 Mwords by 16 bits. For purposes of simplicity, the mapping will be described with respect to the single designated block 320 of FIG. 3A, however it can be readily understood that separate mapping may be performed in essentially the same manner.

In the example of FIG. 4, the last two blocks corresponding to the SDRAM address space are used by the controller 308 and firmware 330 as a command channel 444 and data channel 442 to the flash memory device 306. The mapping and other information 332 (FIG. 3) in these blocks 442 and 444 may be read and written by the controller 308 via any suitable protocol understood by the controller 308 and the source of that additional information (e.g., firmware code 330). Thus, by accessing the additional information 332 (or 333 in FIG. 3B) at the controller 308, e.g., the last two one kilobyte word blocks, command and data paths for communicating with the flash device 306 are established. Other information may also be in these spaces. For example, the device firmware 330 can use this section of memory to employ a bootstrapping protocol by which the firmware 330 can determine whether the memory device is truly a hybrid device, because in general the hybrid memory device 302A of FIG. 3 otherwise would be indistinguishable from a conventional SDRAM device. Other possible data communicated via these blocks may, for example, inform the controller 308A where the designated block 320 is (or blocks in FIG. 3B are) located within the addressable memory; e.g., in this manner, the designated blocks can move, including dynamically if desired.

Turning to an explanation of the operation of one example hybrid memory device, one suitable command protocol comprises a serial protocol used to transfer address block and command information (e.g., 332 in FIG. 3A) for the flash device. Note that because the controller 308A is responsible for translation of the command and address information, the protocol is configurable to access different types of flash devices; e.g., one type of NAND device uses a NOR SRAM interface, whereby the control logic accesses blocks of data, which are then be serialized to suit the SDRAM data delivery protocol. Write data to the flash 306 will likewise be converted by the controller 308A as required by the flash protocol, e.g., 2 KB is written at a time to one such flash device.

As can be readily appreciated, because SDRAM is presently one or more orders of magnitude faster than flash, the protocol includes a way for the controller 308A to signal to the firmware 330 when a flash read or write request is busy and when the request is ready. A status register in the location 332 may be used. For example, the firmware 330 sends a read or write command via the command block 332; the status, which may be a bit that is part of the command, is set by the controller upon receiving a flash request to zero to indicate busy. Note that the controller 308A need not flip the status to busy if on a read request the controller 308A knows that the designated block already contains the correct data for the current mapping.

In a typical situation, the controller 308A sets the status to busy and for a read, and begins filling the buffer 310 with the requested data. When the buffer contains the correct data, (which may be more than requested in anticipation of a subsequent read request), the controller 308A toggles the status to ready. The firmware 330, which is polling the status since it sends the request, then knows the requested data can be read, which the controller 308A then outputs from the buffer 310. For example, in accordance with the SDRAM protocol, the controller will output a single set of data (e.g., byte) for the requested address if a single output is requested, or a timed burst output of multiple sets of data starting with that address, with the number of sets output corresponding to the current burst mode. Note that the current burst mode may be established via a hardwired setting, including a setting that indicates the burst mode is soft-controlled; in any event the mode is known to the controller 308A via the SDRAM-equivalent setup lines and/or a command (for soft-controlled burst).

Writes are similarly handled, with the data at the designated block copied by the controller 308A into the buffer 310, while the controller provides a busy signal that is polled by the firmware until the write request is actually completed by writing to the slower flash. As with a read request, for a write request the hybrid memory device 302A appears to the CPU 389 to operate at the correct SDRAM speeds, and the CPU is unaware of any status polling going on between the firmware 330 and the controller 308A. Via the protocol, synchronous memory is thus operated properly from the perspective of the CPU, but is actually operated asynchronously from the perspective of the requesting entity.

Thus, by adding a memory controller to a hybrid memory device comprising SDRAM and flash with a standard SDRAM interface, the flash memory is overlaid in the SDRAM address space. A command protocol (e.g., serial) is used to manage the mapping of the flash blocks/pages to the SDRAM address space. This permits a single pin compatible multi-chip package to replace an existing SDRAM device in any computing device that wants to provide flash storage, yet do so with only firmware changes to the device. For example, the buffer of a conventional disk drive may be replaced with a single chip upgrade that provides flash storage, whereby the flash storage can be used with new firmware to upgrade existing drives to hybrid drives. Further examples include adding nonvolatile storage to a set-top-box design, or a mobile phone design that was designed with no built-in mass storage at the time, but is now desirable, e.g., due to some new application or business model.

Figure 5:
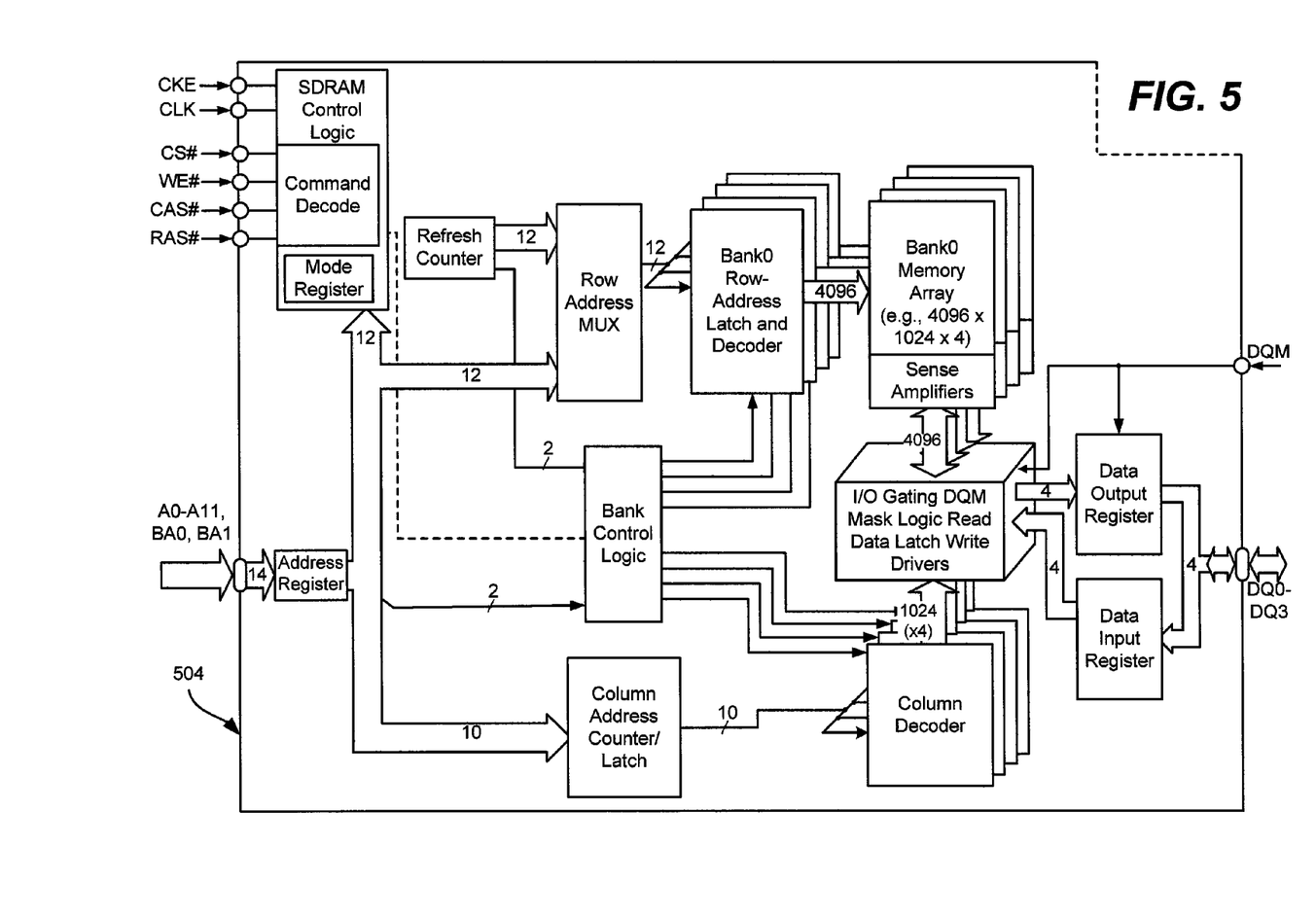
FIG. 5 is an example representation of one suitable type of SDRAM device that may be incorporated into a hybrid memory device.
Figure 6:
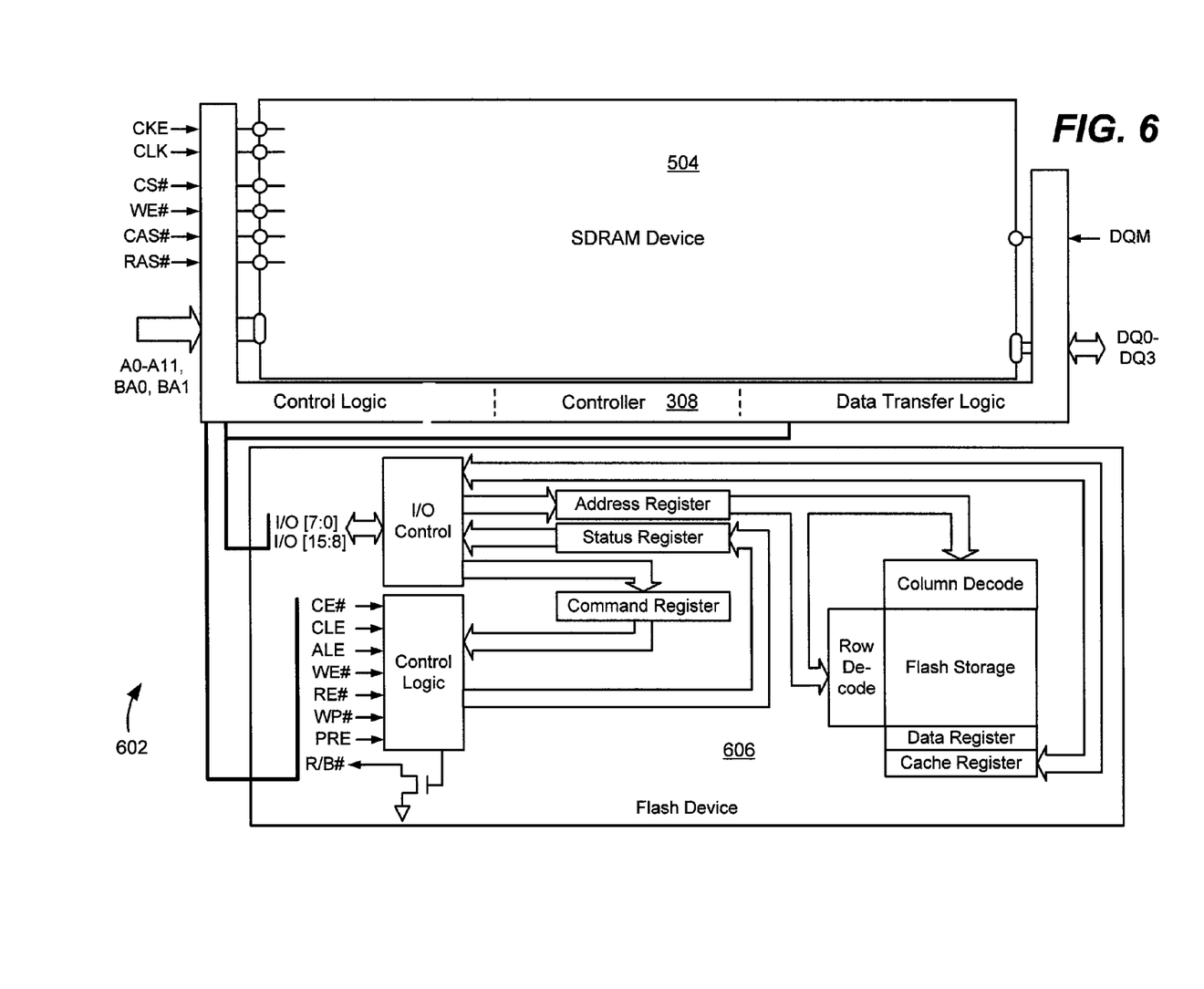
FIG. 6 is an example representation of a hybrid memory device with an SDRAM interface containing an SDRAM device such as the device of FIG. 5 and a flash device.

By way of example of a specific architecture, FIGS. 5 and 6 demonstrate the use of actual SDRAM and NAND Flash devices, with the interface and internal components configured for one example SDRAM voltage protocol and SDRAM access protocol, whereby only software changes (e.g., in device firmware) are needed to now make use of the nonvolatile memory in the package. However, it is understood that essentially any device with defined addressing characteristics may be used. Note that the architecture in FIGS. 5 and 6 show the use of 16 bit data paths, which is a common application, although as can be readily appreciated, other data path widths work in the same manner. In this example, a multi-chip package is described that can physically replace the SDRAM chip in a computing device, yet incorporates both volatile SDRAM memory as well as nonvolatile NAND flash memory.

The SDRAM device 504 represented in FIG. 5 comprises a burst mode device (e.g., a Micron® MT48LC4M16A2 device) supporting 1 byte, 2 byte, 8 byte, or page transfers, and for example, may be used in a hybrid memory device 602 (FIG. 6) that includes two gigabits of NAND Flash 606. As represented in the example architecture for the SDRAM device of FIG. 5, as with a conventional SDRAM device, the hybrid memory device accepts RAS/CAS (the well-known row access strobe and column access strobe) signals on the address lines (e.g., A0-A11, BA0-BA1), and for other than single byte reads or writes, reads or writes data sequentially from the RAS/CAS starting address. Note that the computing device that uses this type of memory buffers the serially accessed data, which is typically done by the onboard cache in many computing devices.

Because the data is provided serially based on a start address, the (relatively low latency) memory controller 308 between the host (e.g., CPU) and the SDRAM 504 is able to detect the addresses being sent to the chip. By detecting particular address ranges, the CE# (enable) for the SDRAM interface can be used to place the device 504 into a refresh cycle, with data provided by another source.

In FIG. 5, the control logic of the controller 308 detects addresses sent to the SDRAM. As described above, when addresses within the designated block are transferred, the controller knows the request is for the flash; note that in this example architecture, the SDRAM device is disabled by preventing CE# passing to the device. The controller's control logic can then either send commands to the flash device 606, or via data transfer logic control the flow of read and write data to the flash device. Note that the command stream to the SDRAM device is not interrupted, and the initialization of the multi-chip package device requires only that the control logic detect the operating burst mode for the SDRAM to understand the data bursts to be used when transferring flash data to the memory data bus.

Thus, in this architecture in which addresses are sent to the SDRAM via RAS/CAS transfers on a separate address bus, by detecting the RAS/CAS cycles in the control logic, commands and data are able to be transferred to and from the flash 606 as appropriate. A serial protocol of writes to the command block for the flash 606 allows the protocol for the flash device to be supported.

The Flash device represented in FIG. 6 (e.g., a Micron® MT29F2G16AABWP device) has a multiplexed bus, whereby data I/O, addresses, and commands share the same pins. Note that I/O pins I/O[15:8] are used only for data in the x16 configuration, with addresses and commands supplied on I/O[7:0]. The command sequence normally includes a command latch cycle, an address latch cycle, and a data cycle, either read or write. Control Signals CE#, WE#, RE#, CLE, ALE and WP# control flash device read and write operations. Note that on a different flash, e.g., an Micron® Gb MT29F8G08FAB device, CE# and CE2# each control independent 4 Gb arrays. CE2# functions the same as CE# for its own array, and operations described for CE# also apply to CE2#.

CE# is used to enable the device. When CE# is low and the device is not in the busy state, the flash memory will accept command, data, and address information. When the device is not performing an operation, the CE# pin is typically driven high and the device enters standby mode. The memory will enter standby if CE# goes high while data is being transferred and the device is not busy. This helps reduce power consumption.

The CE# "Don't Care" operation allows the NAND Flash to reside on the same asynchronous memory bus as other flash or SRAM devices. Other devices on the memory bus can then be accessed while the NAND Flash is busy with internal operations. This capability is for designs that require multiple NAND devices on the same bus, e.g., one device can be programmed while another is being read. A HIGH CLE signal indicates that a command cycle is taking place. A HIGH ALE signal signifies that an address input cycle is occurring. Commands are written to the command register on the rising edge of WE# when CE# and ALE are LOW, and CLE is high and the device is not busy. Exceptions to this are the read status and reset commands.

With this particular component, commands are transferred to the command register on the rising edge of WE#; commands are input on lines I/O[7:0] only. For devices with a x16 interface, lines I/O[15:8] need to be written with zeros when issuing a command. Addresses are written to the address register on the rising edge of WE# when CE# and CLE are low, and ALE is high and the device is not busy. Addresses are input on I/O[7:0] only; for devices with a x16 interface, I/O[15:8] needs to be written with zeros when issuing an address. Generally all five address cycles are written to the device. An exception to this is the block erase command, which requires only three address cycles.

Figure 7:
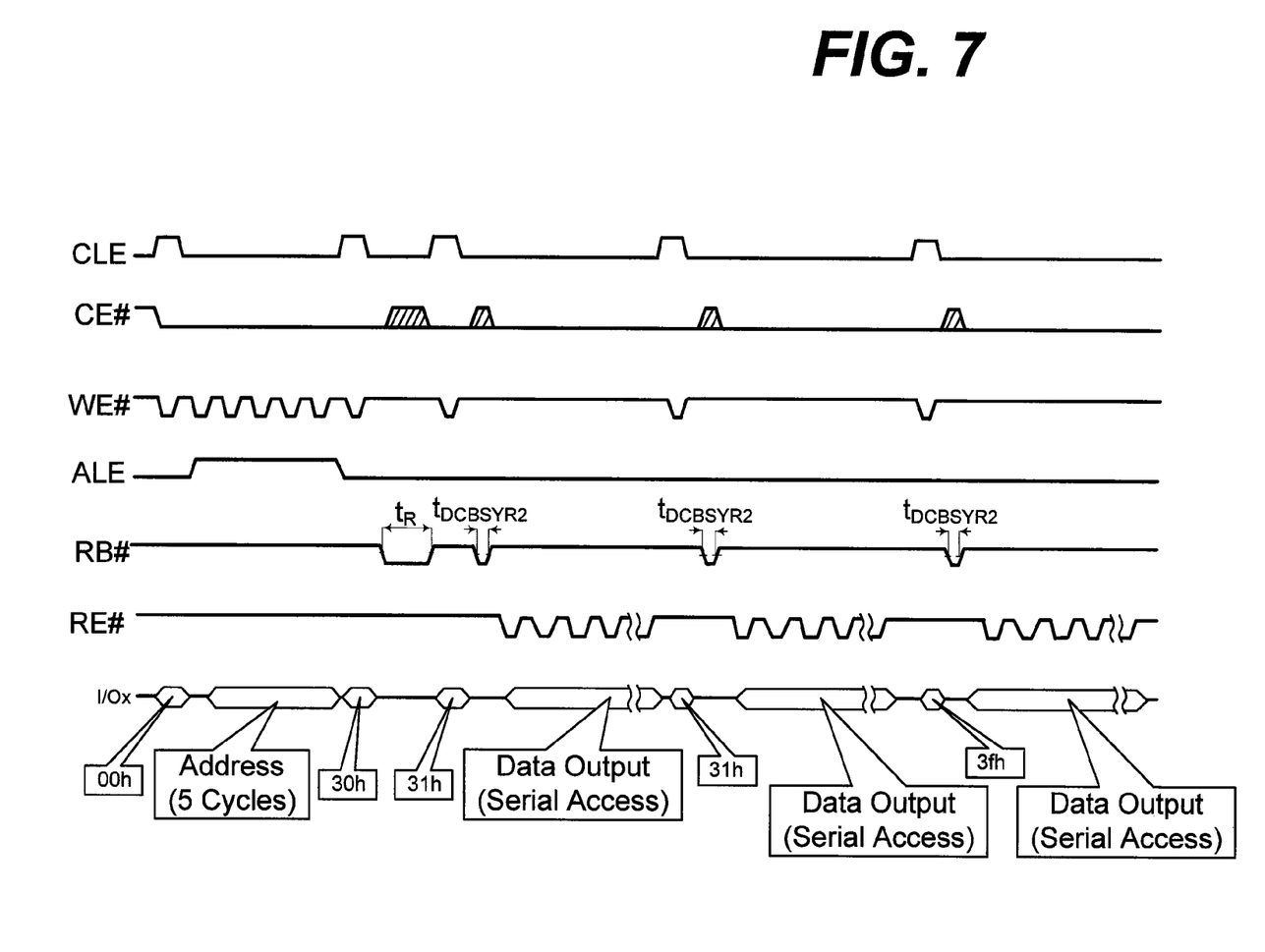
FIG. 7 is an example representation of a timing diagram for controlling an SDRAM device and a flash device.

The flash device exemplified herein is a multiplexed device, whereby the address, commands and data flow across a simple 16-bit interface in a serial fashion. FIG. 7 exemplifies the serial nature of the address command and data transfer protocol timing to the exemplified flash device. Note that address, commands and data are sent from the SDRAM interface (which is non-multiplexed) by writing sequentially to the command and data blocks.

As described above, by detecting writes to the command block in the address space of the SDRAM, the data required can be transferred to the flash device by the controller 508. The address transfer shown above can be expanded to show the transfer of address information to the flash device. As also described above, the address information for the flash memory is transferred by performing multiple writes to the command block address on the SDRAM. SDRAM data in this area is unavailable, since the device would be deselected for these writes. In this serial manner the address data and command information can be written and read from the Flash device. The control logic implements further command protocols as described above, e.g., to permit the flash device to be isolated from the SDRAM device speed considerations. For example, by buffering the status of the flash device in the control logic, additional command responses that indicate busy and execution status may be added to the serial protocol. Data and status returned from the flash device are buffered into a small block of SRAM in the data transfer logic, so that the read and write speeds to flash match that of the SDRAM.

Figure 8:
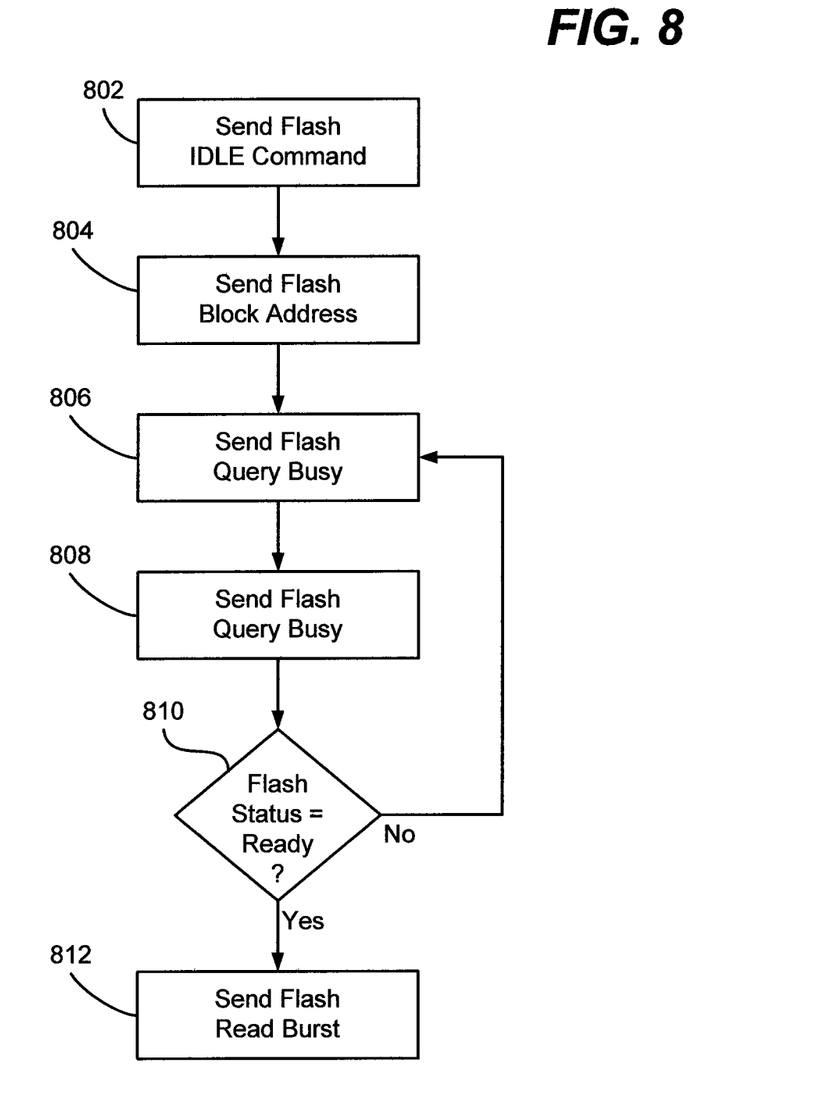
FIG. 8 is a representation of example steps corresponding to how the controller may output flash data to a SDRAM device configured for burst data output.

A typical example of serial transfer to the flash device is represented in FIG. 8, which represents example reads and writes by the firmware 330 to the SDRAM address space 332 (FIG. 3) that is reserved for controlling the flash 306. In general, the firmware sends a flash command at step 802 by writing an IDLE command to the address space 332 which the controller detects.

At step 804, the firmware sends a flash block address request, comprising five address writes that indicate which block to use and which address, along with one write command to the command address space. The controller then has the information it needs to perform the write.

At each of steps 806 and 808, the firmware 330 polls for the status by issuing a write command and a burst read, looping via step 810 until the ready status is detected, and the flash read burst (step 812) is sent.

In an alternative implementation, a register-based protocol provides access to the flash by loading a series of registers, including writing a register with a busy word set to start the execution of the command. This allows a single page write to initiate the writing or fetching of flash block or blocks. In this alternative, the busy word is toggled by the controller when the command has been completed. Supported commands include fetch address/block (or fetch address range), write address/block (or write address range), and delete address/block (or delete address range).

Moreover, because the controller includes logic, the controller can perform flash management. For example, flash wears out after some number of reads and writes, and thus the controller can remap access to balance the usage of the various available blocks of flash, referred to as wear leveling. The controller logic can also perform error detection and correction, and perform bad block management by logically removing known bad blocks from being available.

Figure 9:
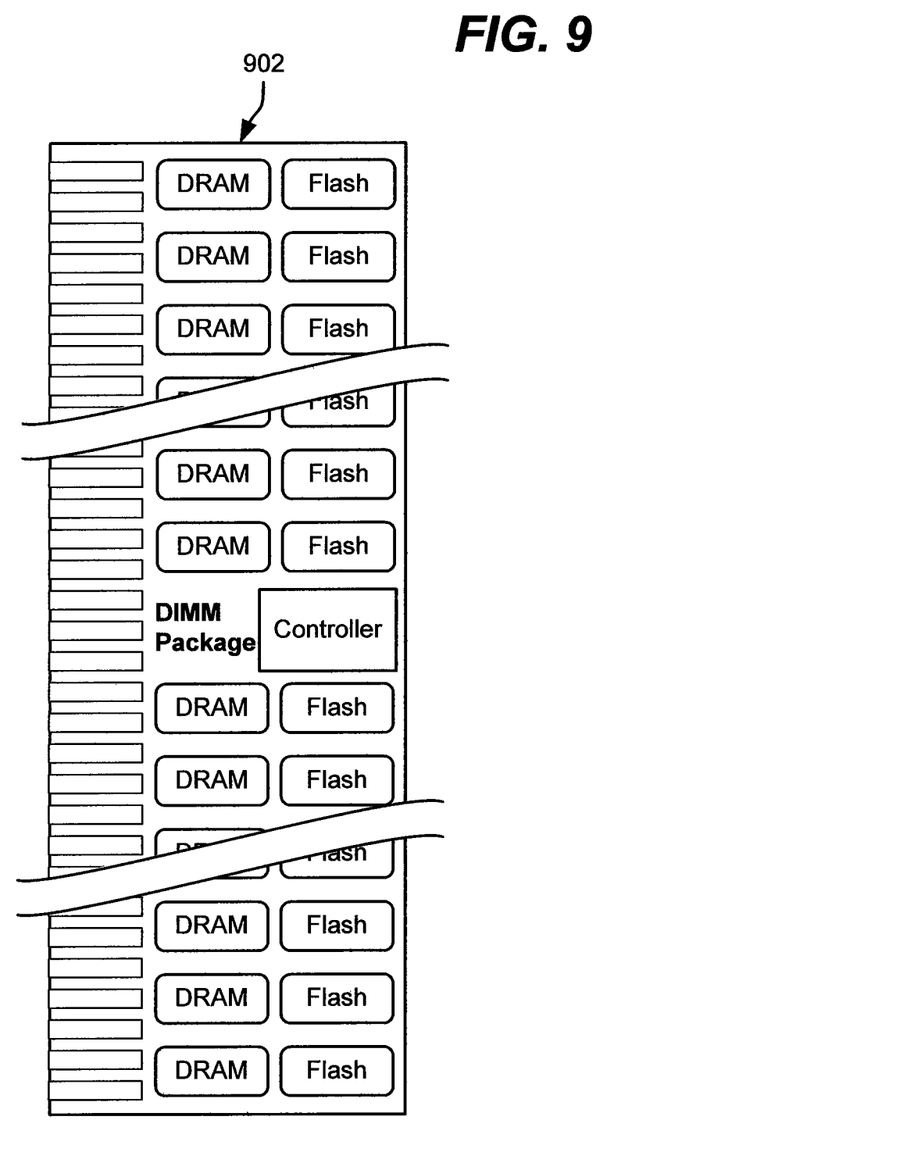
FIG. 9 is a representation of how flash may be added to a dual inline memory module (DIMMM) for adding flash to DRAM-based (including SDRAM) personal computer memory.

FIG. 9 is an example representation of a dual-inline memory module (DIMM) 902, exemplifying how flash may be added to conventional personal computer system memory. The physical flash chips may be on the same side as the SDRAM chips, on the opposite side, or both. The controller may be on the DIMM itself, or alternatively may be external to it, with the ability to disable the SDRAM and substitute flash data as desired.

When the personal computer is turned on, the BIOS (firmware) tests for the presence of the hybrid DIMM memory, and if present, loads at least some of the SDRAM memory (its code) from the flash. The presence of the non-volatile flash memory enables boot or resume operations from data stored in flash. For example, data is accessed from the CPU memory cache which is mapped to blocks of memory and resolved from either SDRAM or flash. If sufficient flash is present, the entire SDRAM may be preserved for hibernation purposes, or the entire operating system loaded, without needing to access peripheral devices such as a hard disk drive.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A method for performing serial transfer to a flash device, and using reads and writes by firmware to address space for non-flash memory reserved for controlling the flash device, comprising:
   sending a command for flash memory, wherein sending the command occurs by at least a controller detecting a command being written to address space reserved for the flash memory, wherein the address space is of a second type of memory that is not flash memory;
   sending a flash block address request;
   polling for status until a ready status is detected; and
   after detecting the ready status, sending a flash read burst.

2. The method of claim 1, wherein the second type of memory is SDRAM.

3. The method of claim 1, wherein sending a command for flash memory comprises writing an IDLE command to the address space reserved for the flash memory.

4. The method of claim 1, wherein sending a flash block address request comprises sending five address writes indicating which block to use and which address, along with one write command to the address space.

5. The method of claim 1, wherein polling for status comprises issuing a write command and a burst read.

6. The method of claim 1, wherein access to the flash device is granted through a register-based protocol that loads a series of registers.

7. The method of claim 6, wherein the series of registers include writing a register with a busy word set to start execution of the command.

8. The method of claim 7, wherein the busy word is toggled by the controller when the command has been completed.

9. The method of claim 6, wherein the controller is configured to receive each of the following as the command:
   fetch address range;
   write address range; and
   delete address range.

10. The method of claim 1, further comprising:
    determining that the flash device has worn out after a number of reads and/or writes;
    logically removing known bad blocks of the flash device from being available; and wear leveling the flash device by at least remapping access to the flash device and balancing usage of various available blocks of flash.

11. A computer-readable storage medium having stored thereon computer-executable instructions that, when executed by a processor of a computing device, cause the computing device to:
send a command for flash memory, wherein sending the command occurs by at least a controller detecting a command being written to address space reserved for the flash memory, wherein the address space is of a second type of memory that is not flash memory;
send a flash block address request;
poll for status until a ready status is detected; and
after detecting the ready status, send a flash read burst.

12. The computer-readable storage medium of claim 11, wherein the second type of memory is SDRAM.

13. The computer-readable storage medium of claim 11, wherein sending a command for flash memory comprises writing an IDLE command to the address space reserved for the flash memory.

14. The computer-readable storage medium of claim 11, wherein sending a flash block address request comprises sending five address writes indicating which block to use and which address, along with one write command to the address space.

15. The computer-readable storage medium of claim 11, wherein polling for status comprises issuing a write command and a burst read.

16. The computer-readable storage medium of claim 11, wherein access to the flash device is granted through a register-based protocol that loads a series of registers.

17. The computer-readable storage medium of claim 16, wherein the series of registers include writing a register with a busy word set to start execution of the command.

18. The computer-readable storage medium of claim 17, wherein the busy word is toggled by the controller when the command has been completed.

19. The computer-readable storage medium of claim 11, further comprising:
determining that the flash device has worn out after a number of reads and/or writes;
logically removing known bad blocks of the flash device from being available; and
wear leveling the flash device by at least remapping access to the flash device and balancing usage of various available blocks of flash.

20. A computing device for performing serial transfer to a flash device, and using reads and writes by firmware to address space for non-flash memory reserved for controlling the flash device, comprising:
a dual-inline memory module (DIMM) comprising:
a plurality of flash chips;
a plurality of SDRAM chips; and
a controller, wherein the controller includes the capability to disable the SDRAM and substitute flash data;
BIOS firmware configured to test for presence of hybrid DIMM memory and, when present, load at least some SDRAM memory from the flash chips, wherein presence of non-volatile flash memory enables boot or resume operations from data stored in the flash chips;
and a hard disk drive, wherein when sufficient flash chips are present, boot-up of the computing device preserves all of the SDRAM chips for hibernation without accessing the hard disk drive.

* * * * *